United States Patent
Lee

(10) Patent No.: US 9,006,826 B2
(45) Date of Patent: Apr. 14, 2015

(54) BUTTED CONTACT SHAPE TO IMPROVE SRAM LEAKAGE CURRENT

(75) Inventor: Tzyh-Cheang Lee, Tainan (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 81 days.

(21) Appl. No.: 13/470,496

(22) Filed: May 14, 2012

(65) Prior Publication Data

US 2013/0299905 A1 Nov. 14, 2013

(51) Int. Cl.
- *H01L 21/8244* (2006.01)
- *H01L 21/768* (2006.01)
- *H01L 23/485* (2006.01)
- *H01L 27/11* (2006.01)

(52) U.S. Cl.
CPC ...... *H01L 27/1104* (2013.01); *H01L 21/76816* (2013.01); *H01L 21/76895* (2013.01); *H01L 23/485* (2013.01); *H01L 2924/00* (2013.01); *H01L 2924/0002* (2013.01); *Y10S 257/904* (2013.01); *Y10S 257/902* (2013.01); *Y10S 257/903* (2013.01)

(58) Field of Classification Search
USPC .............. 257/902–904, E27.098, E21.661
See application file for complete search history.

(56) References Cited

U.S. PATENT DOCUMENTS

| | | | |
|---|---|---|---|
| 5,593,922 A | 1/1997 | Liaw et al. | |
| 6,146,981 A | 11/2000 | Chen | |
| 2007/0023832 A1* | 2/2007 | Matsui | 257/344 |
| 2007/0034968 A1* | 2/2007 | Nishida et al. | 257/369 |
| 2008/0001226 A1* | 1/2008 | Hirano et al. | 257/351 |
| 2008/0179676 A1* | 7/2008 | Hirano et al. | 257/350 |
| 2008/0308848 A1* | 12/2008 | Inaba | 257/255 |
| 2011/0140203 A1* | 6/2011 | Hou et al. | 257/401 |

* cited by examiner

*Primary Examiner* — Steven Loke
*Assistant Examiner* — Juanita B Rhodes
(74) *Attorney, Agent, or Firm* — Eschweiler & Associates, LLC

(57) ABSTRACT

The present disclosure relates to an SRAM memory cell. The SRAM memory cell has a semiconductor substrate with an active area and a gate region positioned above the active area. A butted contact extends along a length (i.e., the larger dimension of the butted contact) from a position above the active area to a position above the gate region. The butted contact contains a plurality of distinct regions having different widths (i.e., the smaller dimensions of the butted contact), such that a region spanning the active area and gate region has width less than the regions in contact with the active area or gate region. By making the width of the region spanning the active area and gate region smaller than the regions in contact with the active area or gate, the etch rate is reduced at a junction of the gate region with the active area, thereby preventing etch back of the gate material and leakage current.

16 Claims, 5 Drawing Sheets

BUTTED CONTACT SHAPE TO IMPROVE SRAM LEAKAGE CURRENT

BACKGROUND

Integrated chips contain millions of transistor devices. Transistors are connected to off chip electronics by way of a series of metal interconnects, which couple the transistor devices to a package (e.g., to a leadframe of a package). The metal interconnects comprise metal layers that progressively increase in size as they get further away from the transistor devices. Typically, the lowest metal layer comprises a contact (e.g., a W contact) that vertically connects a transistor device (e.g., a polysilicon layer or a well of a transistor) to a first metal interconnect layer that runs parallel to the surface of the integrated chip.

In SRAM memory cells, butted contacts are widely used to connect one or more transistor devices (e.g., a polysilicon layer, a well layer) to a first metal interconnect layer. Butted contacts are large contacts that enable connection of one or more gates (e.g., comprising a polysilicon material) to one or more active areas (i.e., diffusion regions) without the use of a horizontal metal interconnect layer. By using a single butted contact to connect to a gate and an active area, the size of an SRAM memory cell can be reduced.

DETAILED DESCRIPTION

Figure 1A:
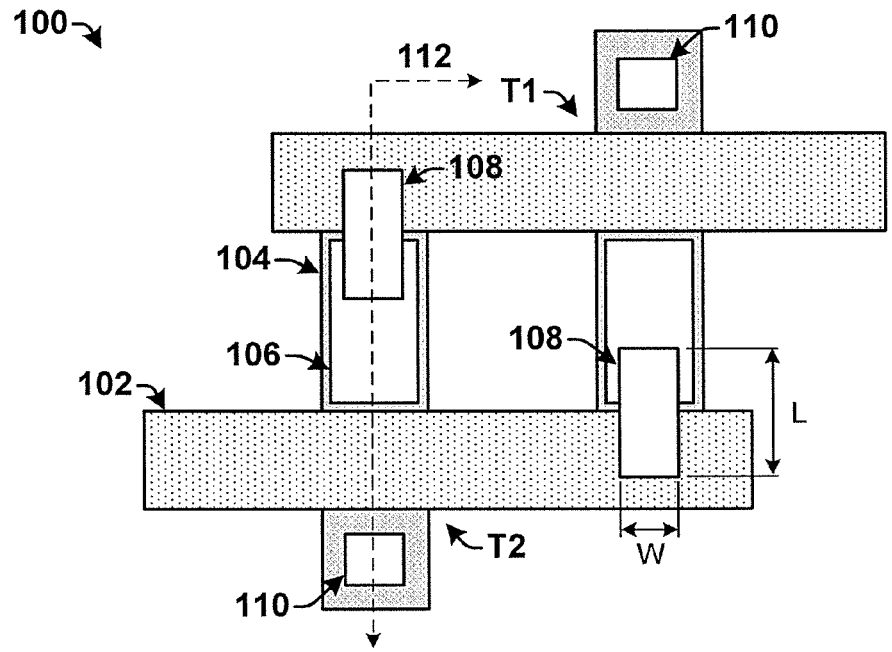
FIG. 1A illustrates a top view of an IC layout for an SRAM memory cell comprising a conventional butted contact connected to a gate region and an active area.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

FIG. 1A illustrates a top view of an integrated chip (IC) layout for a conventional SRAM memory cell 100. The SRAM memory cell 100 comprises a butted contact 108 that provides an electrical connection between a first transistor T1 and a second transistor T2.

The first and second transistors T1, T2 each comprise a gate structure 102 that extends over an active area 104 comprising a lightly doped drain 106. The butted contact 108 is a rectangle, having a width W and a length L, which extends from the lightly doped drain 106 of the second transistor T2 to the gate structure 102 of the first transistor T1, thereby providing a cross-connection between inverters of the SRAM memory cell 100. The SRAM memory cell 100 also comprises a nominal contact 110 in contact with the active area 104, which has a width W and length W.

Figure 1B:
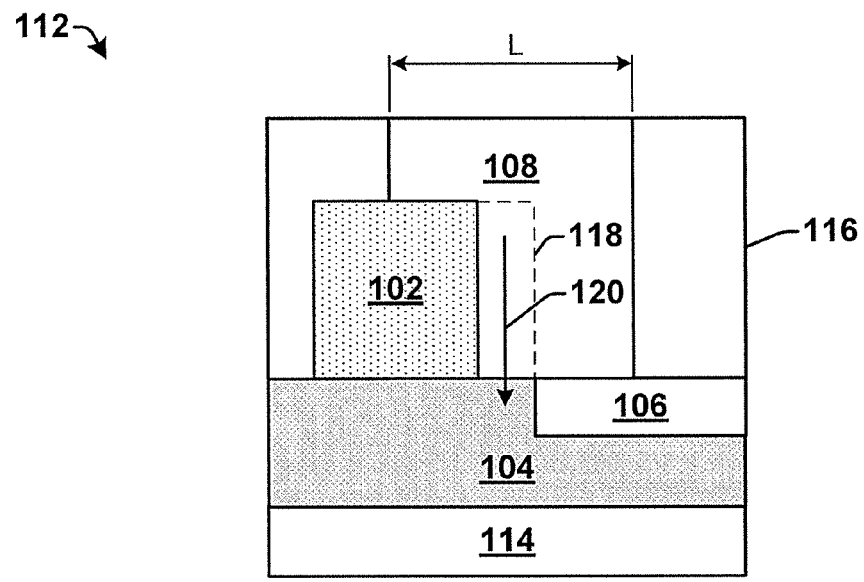
FIG. 1B illustrates a side view of a conventional butted contact connected to a gate region and an active area.

FIG. 1B illustrates a cross-sectional view 112 SRAM memory cell 100.

During fabrication of the butted contact 108, a dielectric material 116 is deposited onto a semiconductor substrate 114 over the gate structure 102 and the active area 104. The dielectric material 116 is lithographically patterned and then etched, resulting in an opening in the dielectric material. Because butted contact 108 is larger than the nominal contact 110, an opening in the dielectric material 116 corresponding to the butted contact 108 is etched at a higher etch rate than an opening in the dielectric material 116 corresponding to the nominal contact 110. This is because a larger opening in the dielectric material 116 associated with the butted contact 108 allows for more etchant particles (e.g., RIE etchant) to enter into the opening than a smaller opening associated with the nominal contact 110. The openings are subsequently filled with a metal (e.g., tungsten) to form the contacts.

The higher etch rate associated with the butted contact 108 can "etch back" the gate structure 102 away from the lightly doped drain 106 within the active area 104, resulting in a butted contact 108 that is in contact with the active area 104. For example, as shown in cross-sectional view 112, during etching of the dielectric material opening for a butted contact, a gate material is etched back from location 118 to form gate structure 102. As the distance between the gate structure 102 and the lightly doped drain 106 increases, the active area 104 underlying the gate structure 102 is exposed. It has been appreciated that a leakage current 120 may leak from the butted contact 108 into the underlying active area 104. This leakage current 120 can be detrimental to operation of the SRAM memory cell 100.

Accordingly, some aspects of the present disclosure provide for an SRAM memory cell comprising a butted contact configured to improve SRAM leakage current. In some embodiments, the SRAM memory cell comprises a semiconductor substrate having an active area and a gate structure positioned above the active area. A butted contact extends along a length (i.e., the larger dimension of the butted contact) from a position above the active area to a position above the gate structure. The butted contact comprises a plurality of regions having different widths (La, the smaller dimensions of the butted contact), such that a region spanning a junction of the active area and the gate structure has width less than other regions of the butted contact (e.g., regions within the active area or gate structure). By making the width of the region spanning the junction of the active area and gate structure smaller than other regions of a butted contact, the etch rate is reduced at the junction, thereby preventing etch back of the gate structure and associated leakage current.

Figure 2:
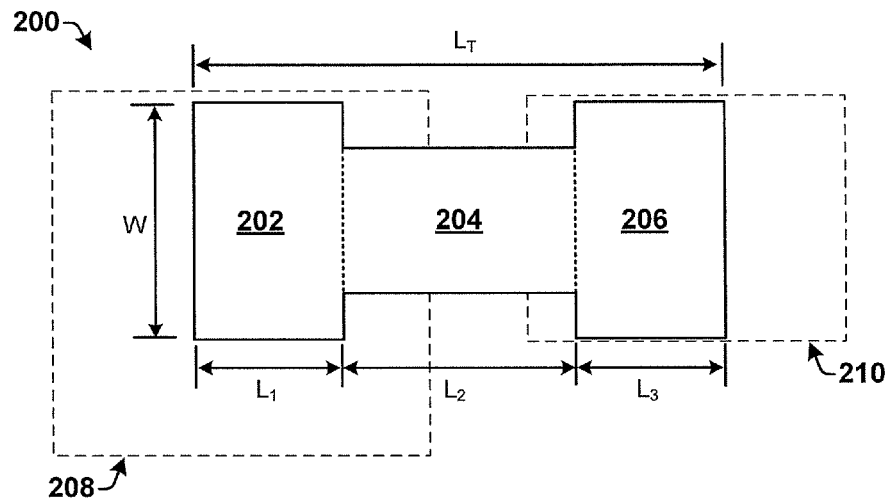
FIG. 2 illustrates a top view of some embodiments of a disclosed butted contact having a shape that improves SRAM leakage current.

FIG. 2 illustrates a top view of some embodiments of a disclosed butted contact 200. It will be appreciated that although FIG. 2 illustrates a butted contact 200 comprising three separate regions, that such a butted contact is not intended to limit the disclosure. For example, in other embodiments, the disclosed butted contact may comprise more or less than three regions.

The butted contact 200 comprises a plurality of distinct regions 202, 204, and 206, wherein respective regions 202-206 have distinct geometric shapes. The union of the plurality of regions 202-206 defines the butted contact 200. In other words, the butted contact 200 comprises a multi-shaped contact formed from the union of the plurality of regions 202-206. In some embodiments, the plurality of regions 202-206 are arranged adjacent to one another in a lateral direction (i.e., along a length of the butted contact 200). For example, butted contact 200 comprises three regions 202, 204, and 206, where region 204 connects region 202 to region 206. The resulting butted contact 200 has a total length of $L_T$ that is equal to the length of each of the distinct regions 202-206, respectively $L_1$, $L_2$, and $L_3$. As provided herein, the term "length" refers to the direction along the greater dimension of the butted contact 200 and the term "width" refers to the direction along the lesser dimension.

During fabrication, a dielectric material overlying a semiconductor substrate is etched to form an opening in which butted contact 200 is to be formed. The geometric shape of each region is associated with an etch rate that is specific to that region. For example, a shape of a first region 202 is associated with a first etch rate that is different than a second etch rate associated with a second region 204 having a different shape. By selecting particular geometric shapes for the different regions, the etch rates achieved within different parts of the butted contact 200 can be varied during formation of the butted contact 200.

In some embodiments, wherein the regions have a square or rectangular shape, the etch rate associated with regions having a larger width is greater than the etch rate associated with regions having a smaller width. For example, because region 204 has a smaller width than regions 202 and 206, the etch rate associated with region 204 is less than the etch rate associated with regions 202 and 206. In some embodiments, the etch rate associated with a region is proportional to the width of the region (i.e., the etch rate of a region is equal to a width of the region multiplied by a scaling factor).

Vertically, the butted contact 200 is configured to extend from a first lower level 208 and a second lower level 210 to one or more upper levels (not shown). Laterally, the butted contact 200 is configured to extend along its length from a first lower level 208 to a second lower level 210 levels. In some embodiments, one or more regions of the butted contact 200 are comprised within a lower level. For example, the first region 202 of the butted contact is comprised within the first lower level 208 (e.g., a doped drain comprised within an active area to form a source/drain region of a first transistor) and the third region 206 of the butted contact is comprised within the second lower level 210 (e.g., a gate structure including a gate region or a gate extension region of a second transistor). In some additional embodiments, one or more regions of the butted contact straddle the two or more lower levels. For example, the second region 204 of the butted contact is configured to straddle the first and second lower levels 208, 210. By associating different regions of the butted contact 200 with different lower levels, the etch rates associated with different regions, at the lower levels or junction thereof, can be controlled.

Figure 3:
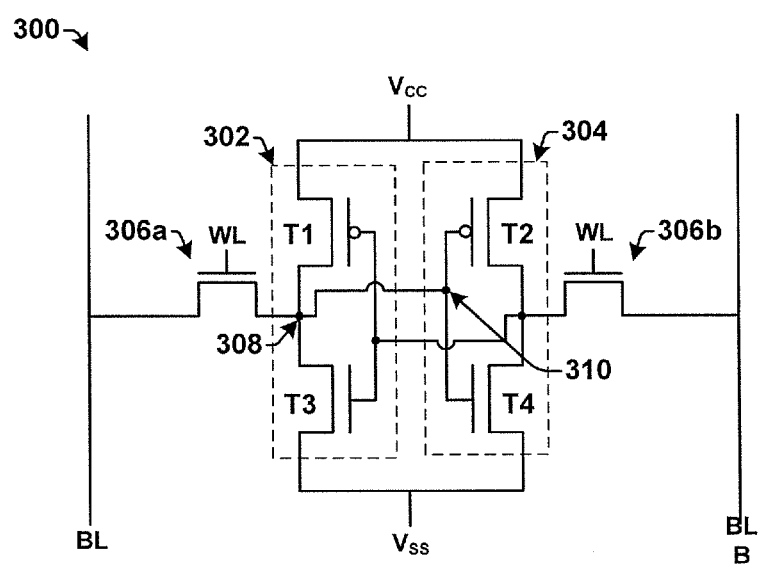
FIG. 3 illustrates a schematic diagram of some embodiments of an SRAM memory cell within an SRAM array.

In some embodiments, the disclosed butted contact may be implemented within an SRAM memory cell. FIG. 3 illustrates a schematic diagram of some embodiments of a 6T SRAM memory cell 300 comprising butted contacts 308 and 310. The SRAM memory cell 300 comprises a first inverter 302 that is cross coupled with a second inverter 304. The first inverter 302 comprises a pull-up transistor T1 and a pull-down transistor T3, while the second inverter 304 comprises a pull-up transistor T2 and a pull-down transistor T4. Two additional access transistors 306a and 306b have gates connected to a word line WL. Upon being selectively activated by the word line WL, the access transistors 306a and 306b connect bit lines BL, BLB to the inverters 302,304 during read and write operations. Butted contacts 308 and 310 connect the gate of transistors within each inverter 302,304 to the source/drain of transistors within the other inverter 304,302.

Figure 4:
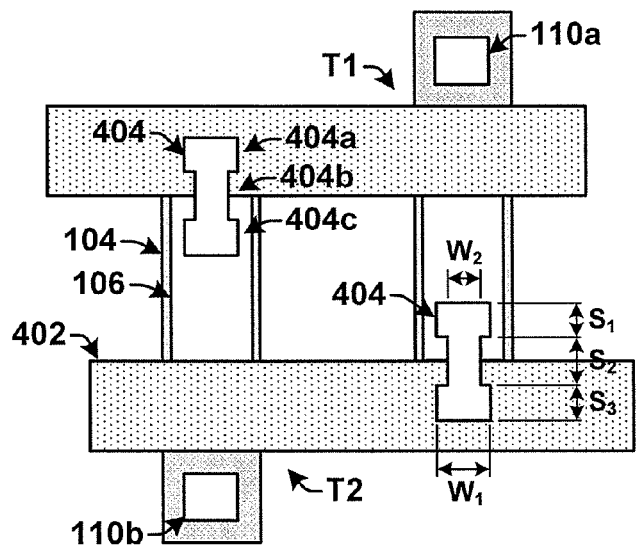
FIG. 4 illustrates a top view of some embodiments of an IC layout for a portion of an SRAM memory cell comprising a disclosed butted contact having a shape that improves SRAM leakage current.

FIG. 4 illustrates a top view of some embodiments of an IC layout 400 corresponding to a portion of SRAM memory cell 300. The IC layout 400 illustrates disclosed butted contacts having a shape that improves SRAM leakage current.

The IC layout 400 comprises two pull-up transistors T1 and T2. Each transistor comprises a gate structure 402 formed over an active area 104. In some embodiments, the gate structure 402 comprises a polysilicon layer and the active area 104 comprises a highly doped diffusion region within a semiconductor substrate. Each transistor further comprises a lightly doped drain 106 located within the active area 104. The lightly doped drain 106 has a lower doping concentration than the active area 104.

A butted contact 404 extends along a length (i.e., greater dimension) from a first end to a second end. The first end of the butted contact 404 is in contact with a gate structure 402 that corresponds to a first transistor T1 within a first inverter. A second, opposite end of the butted contact 404 is in contact with a lightly doped drain 106 that corresponds to a second transistor T2 within a second inverter. Therefore, the butted contact 404 connects the gate of transistors within one inverter to the source/drain of transistors within a cross coupled inverter (as shown in schematic diagram 300). Nominal contacts 110 are also located on the active area 104 and are configured to provide a voltage $V_{cc}$ to source terminals of transistors T1 and T2.

In some embodiments, the butted contact 404 comprises a dumbbell shape comprising a first region 404a, a second region 404b, and a third region 404c. The first and third regions 404a, 404c are located at the longitudinal ends of the butted contact 404, while the second region 404b is located at a longitudinal center of the butted contact 404, which is between the first and second regions 404a, 404c. The first region 404a is in contact with the gate structure 402 and comprises a first width $W_1$. The second region 404b straddles a junction of the gate structure 402 and the lightly doped drain 106 and has a second width $W_2$ less than the first width $W_1$. The third region 404c is in contact with the lightly doped drain 106 and comprises the first width $W_1$.

By forming the second region 404b to have a lower width $W_2$ than the first and third regions, 404a and 404c, the etch rate associated with the second region 404b is reduced relative to the etch rate associated with the first and third regions, 404a and 404c. By reducing the etch rate associated the second region 404b, etch back of the gate structure 402 away from the lightly doped drain 106 can be reduced, minimizing leakage current from the butted contact 404 to the active area 104. In some embodiments, the second region 404b of the butted contact 404 can be selected to have a width that balances the etch rate of the second region 404b of the butted contact with the etch rate of the nominal contact 110.

Figure 5:
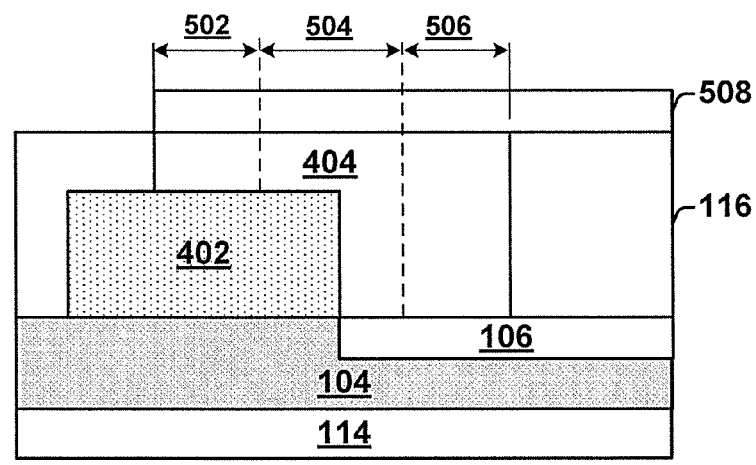
FIG. 5 illustrates a side view of some embodiments of a disclosed butted contact having a shape that improves SRAM leakage current.

FIG. 5 illustrates a side view 500 of some embodiments of an SRAM memory cell comprising a butted contact 404 having a shape that improves SRAM leakage current.

Horizontally, the butted contact 404 extends from the gate structure 402 to the lightly doped drain 106. Vertically, the butted contact 404 extends from the gate structure 402 and the lightly doped drain 106 to an overlying metal interconnect layer 508. During operation, the butted contact 404 is configured to provide for electrical contact between the gate structure 402, the lightly doped drain 106, and the overlying metal interconnect layer 508.

Butted contact 404 comprises three regions; a first region 502 having a first width, a second region 504 having a second width less than the first width, and a third region 506 having a third width greater than the second width. The first region 502 is located entirely above the gate structure 402. The second region 504 is located at a position that is above a junction of the gate structure 402 and the lightly doped drain 106. The third region 506 is located at a position that is entirely above lightly doped drain 106.

Figure 6:
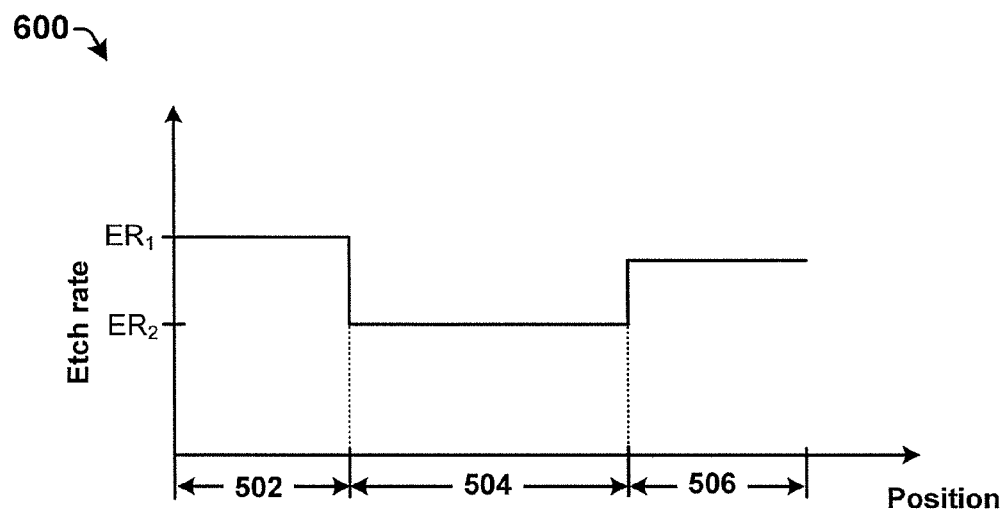
FIG. 6 illustrates a graph showing the etching rate of different regions of the disclosed butted contact.

FIG. 6 illustrates a graph 600 showing an exemplary etch rate associated with different regions of the disclosed butted contact 404. As shown in graph 600, a first etching rate $ER_1$ is associated with the first region 502. A second etching rate $ER_2$ is associated with the second region 504, wherein the second etching rate $ER_2$ is less than the first etching rate $ER_1$. A third etching rate $ER_3$ is associated with the third region 506, wherein the third etching rate $ER_3$ is greater than the second etching rate $ER_2$. In some embodiments, the first and third etching rates, $ER_1$ and $ER_3$, are substantially the same.

By reducing the etching rate within the second region 504, which is above a junction between the gate structure 402 and the lightly doped drain 106, on the sidewall of the gate structure 402 is reduced. This reduction in etch rate on the sidewall of the gate structure 402 reduces etch back of the gate structure 402 away from the lightly doped drain 106. By reducing etch back of the gate structure 402 away from the lightly doped drain 106, the leakage current from the butted contact 404 to the underlying active area 104 is reduced.

Figure 7A:
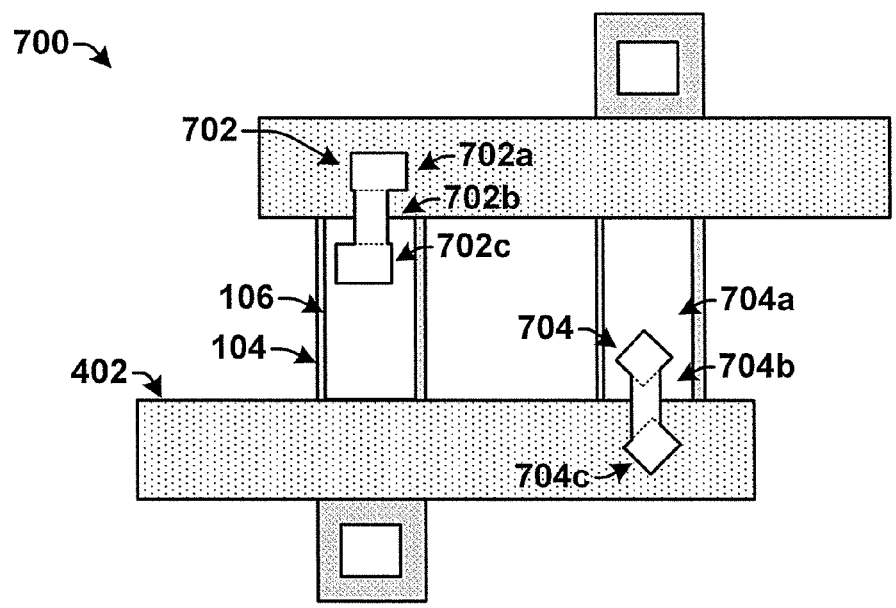
FIG. 7A-7B illustrates some alternative embodiments of IC layouts or a portion of an SRAM memory cell comprising a disclosed butted contact connected to a gate region and an active region.
Figure 7B:
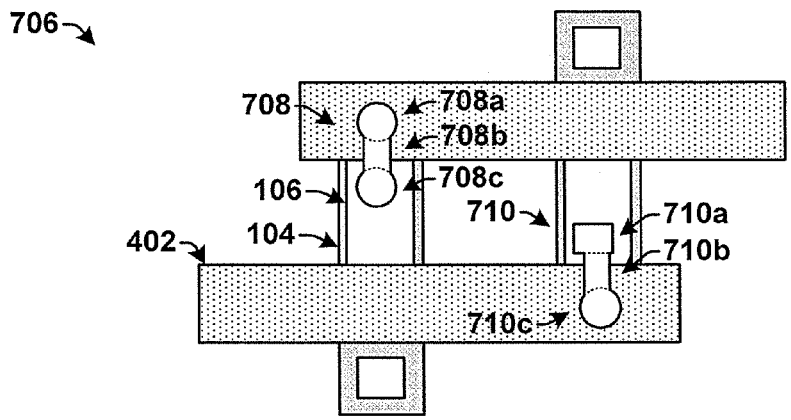

FIGS. 7A-7B illustrates some alternative embodiments of disclosed butted contacts within an SRAM memory cell 700, 706. As shown in FIGS. 7A-7B, the different regions of a disclosed butted contact can comprise a variety of different geometric shapes. It will be appreciated that the butted contacts shown in FIGS. 7A and 7B are examples intended to show that the butted contact may comprise regions having a variety of shapes, and are not limiting to the shapes that may be used for different regions of a disclosed butted contact.

FIG. 7A illustrates a SRAM memory cell 700 having butted contacts, 702 and 704, comprising regions with rectangular shapes.

SRAM memory cell 700 comprises a first butted contact 702 having different regions comprising rectangular shapes. In some embodiments, the rectangular shapes may be oriented about an axis of symmetry. For example, a first region 702a comprises a rectangular shape that is horizontally rotated about an axis of symmetry extending along the length of butted contact 702 with respect to the rectangular shape in the third region 702c. SRAM memory cell 700 further comprises a second butted contact 704 comprising a first region 704a and a second region 704b comprising rectangular shapes that have been rotated by 45 degrees relative to the rectangular shapes within regions 702a and 702b.

FIG. 7B illustrates a SRAM memory cell 706 having butted contacts 708 and 710, comprising regions with alternative examples of shapes.

SRAM memory cell 706 comprises a first butted contact 708 comprising a first region 708a and a third region 708c having a circular shape. The first and third regions, 708a and 708c, are connected by a second region 708b having a rectangular shape with a smaller width than that of the circular shapes (wherein the "width" of the circular shape is defined as being equal to the diameter of the circular shape along the width of the butted contact 708). SRAM memory cell 706 further comprises a second butted contact 710 comprises a first region 710a having a rectangular shape and a third region 710c comprising a circular shape. The first and third regions, 710a and 710c, are connected by a second region 710b having a rectangular shape with a smaller width than that either the rectangular shape of the first region 708a or the circular shape of the third region 710c.

Figure 8:
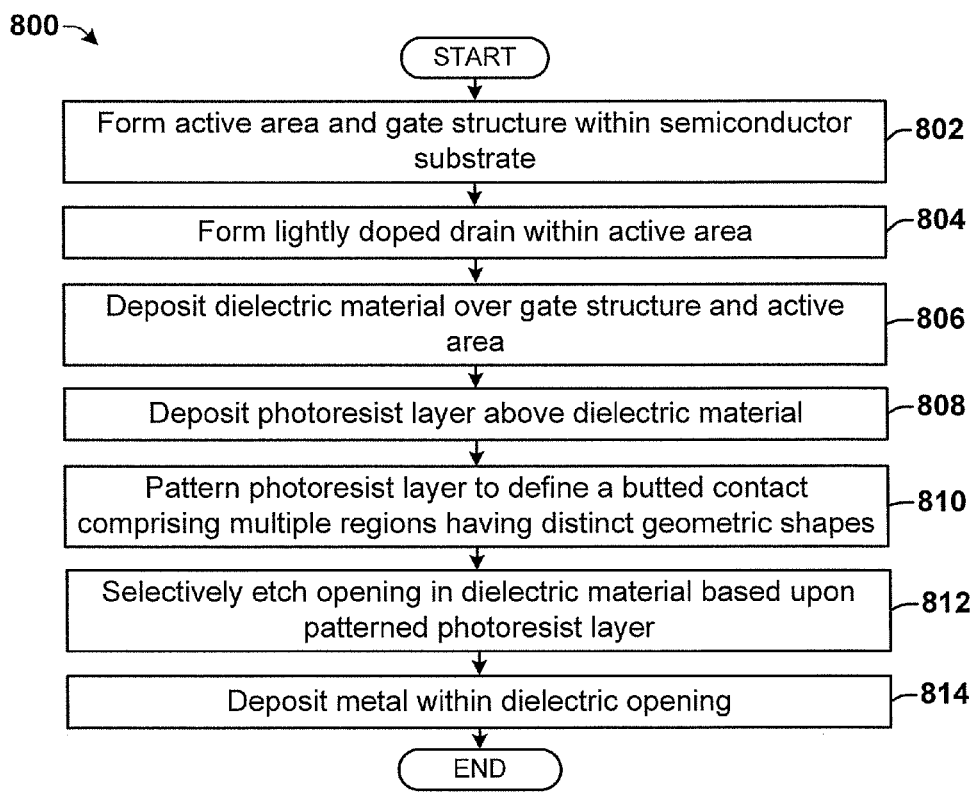
FIG. 8 is a flow diagram of some embodiments of a method of forming a butted contact having a shape that improves SRAM leakage current.

FIG. 8 is a flow diagram of some embodiments of a method 800 of forming a butted contact having a shape that improves SRAM leakage current. While the method 800 provided herein is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 802 an active area and a gate structure are formed within a semiconductor substrate. The gate structure is formed over the active area to define a semiconductor device.

At step 804 a lightly doped drain is formed within the active area. The lightly doped drain is formed within the active area at a position that abuts the gate structure.

At step 806 a dielectric material is deposited over the gate structure and active area. In some embodiments, the dielectric material comprises a low-k dielectric material. In some embodiments, the inter-level dielectric material comprises an ultra low-k (ULK) spin-on glass (e.g., having a dielectric constant, k≈2.2). Such a ULK spin-on glass (SOG) is an inter-level dielectric material that can be applied to a substrate in liquid form. The ULK spin-on glass may be deposited onto the surface of the substrate by spin coating resulting in a substantially planarized ultra low-k dielectric material.

At step 808 a photoresist layer is deposited above the dielectric material. The photoresist layer may be spun on to the substrate above the dielectric material. The patterned photoresist layer is formed by depositing photoresist onto the surface of the substrate and then patterning the deposited photoresist to form cavities defining a platting area where the metal layer structures of the metallization layer (e.g., the via or metal line) are to be formed. In one embodiment, a light sensitive positive tone photoresist is applied to the surface of the substrate by spin coating the substrate with the photoresist at a high RPM.

At step 810 the photoresist layer is selectively patterned to define a butted contact comprising a plurality of regions having distinct geometric shapes. In some embodiments, patterning the photoresist layer comprises exposing and developing an area of the photoresist that defines a butted contact comprising multiple distinct regions having different geometric shapes. In some embodiments, the distinct regions have different widths. The photoresist lay may be selectively exposed to a light source (e.g., UV light) using a photolithography exposure tool, for example. The light causes some portions of the photoresist layer to become more soluble, while other portions of the photoresist remain insoluble to a photoresist developer. A photoresist developer is then used to remove the more soluble areas leaving the patterned resist with a structure with cavities that define the location where a butted contact is to be formed.

At step 812 the exposed dielectric material is selectively etched away to form an opening within the dielectric material that defines the butted contact. Etching within distinct regions of the butted contact having a larger width proceeds at a higher etching rate than at distinct regions of the butted contact having a smaller width. In some embodiments, the etch rate of a region above a junction of the gate structure and the active area is selected to be lower than the etch rate of regions above the gate structure and/or the active area. By reducing the etch rate at the junction of the gate structure and the active area, etch back of the gate structure away from the lightly doped drain is prevented.

At step 814 a metal is deposited within the opening of the dielectric material. In some embodiments, a diffusion barrier layer is disposed over the surface of the dielectric material prior to depositing the metal. The diffusion barrier layer prevents diffusion of the metal layer into the surrounding dielectric material. In some embodiments the diffusion layer comprises a Ta-based film. After deposition of the metal, the substrate can be planarized using a chemical mechanical polishing (CMP) process, as known by one of ordinary skill in the art. Because the etching rate at the junction of the gate structure and the active area is small, contact between the metal and the underlying active area is minimized, minimizing leakage current.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a butted contact having a structure that reduces an etch rate to prevent leakage current in an SRAM memory cell.

In some embodiments, the present disclosure relates to an integrated chip, comprising a first lower level of the integrated chip and a second lower level of the integrated chip. A butted contact comprised within a dielectric material overlying the first lower level and the second lower level extends along a length from a position above the first lower level to a position above the second lower level. The butted contact comprises a plurality of distinct regions that respectively comprise a geometric shape associated with an etch rate that is particular to the geometric shape.

In another embodiment, the present disclosure relates to an SRAM memory cell, comprising an active area located within a semiconductor substrate and a lightly doped drain comprised within the active area. A gate structure is positioned above the active area and adjacent to the lightly doped drain.

A butted contact extends along a length from a position above the lightly doped drain to a position above the gate structure. The butted contact comprises a first region having a first width, wherein the first region is located at a first longitudinal end of the butted contact. The butted contact further comprises a second region having a second width smaller than the first width, wherein the second region is located at a longitudinal center of the butted contact. The butted contact further comprises a third region having a third width greater than the second width, wherein the third region located at a second longitudinal end of the butted contact opposite the first longitudinal end.

In another embodiment, the present disclosure relates a method of forming a butted contact. The method comprises forming an active area and an overlying gate structure within a semiconductor substrate. The method further comprises forming a lightly doped drain within the active area, wherein the lightly doped drain abuts the gate structure. The method further comprises depositing a dielectric material on top of the active area and gate structure. The method further comprises patterning a photoresist layer overlying the dielectric material to define a butted contact, comprising a plurality of regions having distinct geometric shapes, that extends from a position above the gate structure to a position above the lightly doped drain. The method further comprises selectively etching the dielectric material based upon the patterned photoresist layer, wherein upon etching the dielectric material respective regions of the butted contact shape are etched at different etch rates that are dependent upon the geometric shape of the region.

What is claimed is:

1. An integrated chip, comprising:
a gate structure positioned above an active area disposed within a semiconductor substrate;
a lightly doped drain region having a lower doping concentration than the active area, wherein the active area abuts the lightly doped drain region;
a butted contact, comprising a plurality of distinct regions that comprise distinct geometric shapes, extending along a length from a first position above the gate structure to a second position above the lightly doped drain region, wherein the plurality of distinct regions comprise:
a central region located above a junction of the gate structure and the lightly doped drain region;
a first outer region linearly extending from the central region to a first end of the butted contact and located entirely above the gate structure; and
a second outer region linearly extending from the central region to a second end of the butted contact, opposite the first end, and located entirely above the lightly doped drain region.

2. The integrated chip of claim 1, the plurality of distinct regions are arranged adjacent to one another along a length of the butted contact, resulting in a total length of the butted contact that is equal to the sum of the lengths of the central region, the first outer region and the second outer region.

3. The integrated chip of claim 1, wherein the butted contact comprises a dumbbell shape, comprising the first outer region and the second outer region located at opposite longitudinal ends of the butted contact that have a greater width than the central region at a longitudinal center of center of the butted contact.

4. The integrated chip of claim 3, wherein the first outer region and the second outer region are symmetric about an axis of symmetry that extends through a width of the central region.

5. The integrated chip of claim 3, wherein the first outer region and the second outer region comprise rectangular shapes.

6. The integrated chip of claim 1, wherein
the active area linearly extends between the gate structure and a second gate structure.

7. The integrated chip of claim 1,
wherein the central region is in contact with the gate structure and the lightly doped drain region.

8. An SRAM memory cell, comprising:
an active area located within a semiconductor substrate;
a lightly doped drain region comprised within the active area and having a lower doping concentration than the active area, wherein the lightly doped drain region abuts the active area;
a gate structure positioned above the active area and adjacent to the lightly doped drain region; and
a butted contact extending along a length from a position above the lightly doped drain region to a position above the gate structure, the butted contact comprising:
   a first region having a first width, wherein the first region is located entirely above the gate structure and abuts a first longitudinal end of the butted contact;
   a second region having a second width smaller than the first width, wherein the second region is located at a longitudinal center of the butted contact;
   a third region having a third width greater than the second width, wherein the third region is located entirely above the lightly doped drain region and abuts a second longitudinal end of the butted contact opposite the first longitudinal end.

9. The SRAM memory cell of claim 8, wherein:
the first region is positioned entirely above the gate structure;
the second region is positioned above a junction of the active area and the lightly doped drain region; and
the third region is positioned entirely above the lightly doped drain region.

10. The SRAM memory cell of claim 8, wherein the butted contact comprises a dumbbell shape.

11. The SRAM memory cell of claim 8, wherein the first region, the second region, and the third region are arranged adjacent to one another along a length of the butted contact, resulting in a total length of the butted contact that is equal to the sum of the lengths of each of the first, second, and third regions.

12. The SRAM memory cell of claim 8, wherein the first region and third region comprise rectangular shapes connected to one another by way of the second region comprising a rectangular shape.

13. The integrated chip of claim 6, wherein the central region is positioned above a junction of the active area and the lightly doped drain region.

14. The SRAM memory cell of claim 8, wherein the lightly doped drain region abuts the gate structure.

15. An SRAM memory cell, comprising:
a lightly doped drain region comprised within and abutting an active area;
a gate structure positioned above the active area and adjacent to the lightly doped drain; and
a second additional gate structure positioned above the active area, wherein the active area linearly extends between the gate structure and the second additional gate structure;
a butted contact comprising a plurality of distinct regions having distinct geometric shapes, wherein the plurality of distinct regions comprise:
   a first region located entirely above the gate structure and having a first width, wherein the first region abuts a first longitudinal end of the butted contact;
   a second region located above a junction of the gate structure and the lightly doped drain and having a second width less than the first width, wherein the second region abuts the first region; and
   a third region located entirely above the lightly doped drain and having a third width greater than the second width, wherein the third region abuts the second region on a first side and a second longitudinal end of the butted contact opposite the first longitudinal end on a second side opposite the first side.

16. The integrated chip of claim 1, wherein the lightly doped drain region abuts the gate structure.

* * * * *